(12) United States Patent
Taskov

(10) Patent No.: US 9,973,144 B2
(45) Date of Patent: May 15, 2018

(54) CIRCUITS AND METHODS FOR INCREASING OUTPUT FREQUENCY OF AN LC OSCILLATOR

(71) Applicant: Skyworks Solutions, Inc., Woburn, CA (US)

(72) Inventor: Georgi Milev Taskov, Santa Ana, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days. days.

(21) Appl. No.: 15/407,200

(22) Filed: Jan. 16, 2017

(65) Prior Publication Data
US 2017/0126178 A1    May 4, 2017

Related U.S. Application Data

(63) Continuation of application No. 14/717,895, filed on May 20, 2015, now Pat. No. 9,584,067, which is a
(Continued)

(51) Int. Cl.
*H04B 1/06*     (2006.01)
*H04B 7/00*     (2006.01)
(Continued)

(52) U.S. Cl.
CPC ........... *H03B 5/1215* (2013.01); *H01L 24/49* (2013.01); *H01L 24/85* (2013.01); *H03B 5/1228* (2013.01); *H04B 1/0458* (2013.01); *H04B 1/18* (2013.01); *H01L 2224/45144* (2013.01); *H01L 2224/4813* (2013.01); *H01L 2224/48091* (2013.01); *H01L 2224/48106* (2013.01); *H01L 2224/48227* (2013.01); *H01L 2224/49176* (2013.01); *H01L 2924/1205* (2013.01); *H01L 2924/1206* (2013.01); *H01L 2924/14211* (2013.01);
(Continued)

(58) Field of Classification Search
CPC ....... H03B 5/1215; H03B 5/1209; H03B 5/08; H03B 5/18; H03B 2200/0022; H04B 1/403; H04B 15/04; B23K 31/02
See application file for complete search history.

(56) References Cited

U.S. PATENT DOCUMENTS 7,336,138 B2    2/2008    Kitamura et al.
7,589,596 B2    9/2009    Masuda et al.
(Continued)

*Primary Examiner* — Andrew Wendell
(74) *Attorney, Agent, or Firm* — Knobbe, Martens, Olson & Bear LLP

(57) ABSTRACT

Disclosed are circuits and methods for increasing an output frequency of an inductance-capacitance (LC) oscillator. In some embodiments, the LC oscillator can be implemented as a voltage-controlled oscillator (VCO) having differential outputs. When the VCO is implemented on a die, wirebond connections from the outputs to a ground results in an effective inductance that impacts a maximum frequency associated with the VCO. An electrical connection such as a wirebond between the differential outputs yields a reduction in the effective inductance thereby increasing the maximum frequency. In some embodiments, the wirebond between the differential outputs can be configured so that its contribution to mutual inductance is reduced or substantially nil.

19 Claims, 11 Drawing Sheets

Related U.S. Application Data continuation of application No. 13/715,018, filed on Dec. 14, 2012, now Pat. No. 9,065,382.

(60) Provisional application No. 61/576,674, filed on Dec. 16, 2011.

(51) Int. Cl.
| | | |
|---|---|---|
| *H04M 1/00* | (2006.01) | |
| *H03B 5/12* | (2006.01) | |
| *H01L 23/00* | (2006.01) | |
| *H04B 1/18* | (2006.01) | |
| *H04B 1/04* | (2006.01) | |
| *H04W 88/02* | (2009.01) | |

(52) U.S. Cl.
CPC ............... *H03B 2200/0026* (2013.01); *H03B 2200/0036* (2013.01); *H04W 88/02* (2013.01)

(56) References Cited

U.S. PATENT DOCUMENTS

| | | | |
|---|---|---|---|
| 9,065,382 B2* | 6/2015 | Taskov | H03B 5/1215 |
| 9,584,067 B2* | 2/2017 | Taskov | H03B 5/1215 |
| 2005/0285262 A1 | 12/2005 | Knapp et al. | |
| 2008/0174375 A1 | 7/2008 | Nakamura et al. | |
| 2008/0315396 A1 | 12/2008 | Kuhlman et al. | |
| 2010/0289592 A1 | 11/2010 | Lee et al. | |
| 2011/0084378 A1 | 4/2011 | Welch et al. | |
| 2011/0156829 A1 | 6/2011 | Wang | |
| 2011/0254123 A1 | 10/2011 | Sellathamby et al. | |

\* cited by examiner

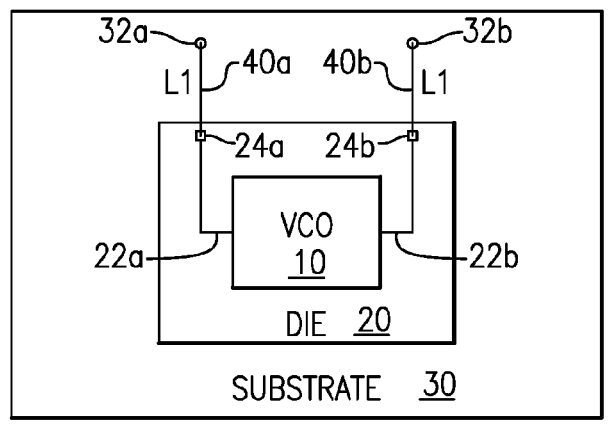
FIG.1
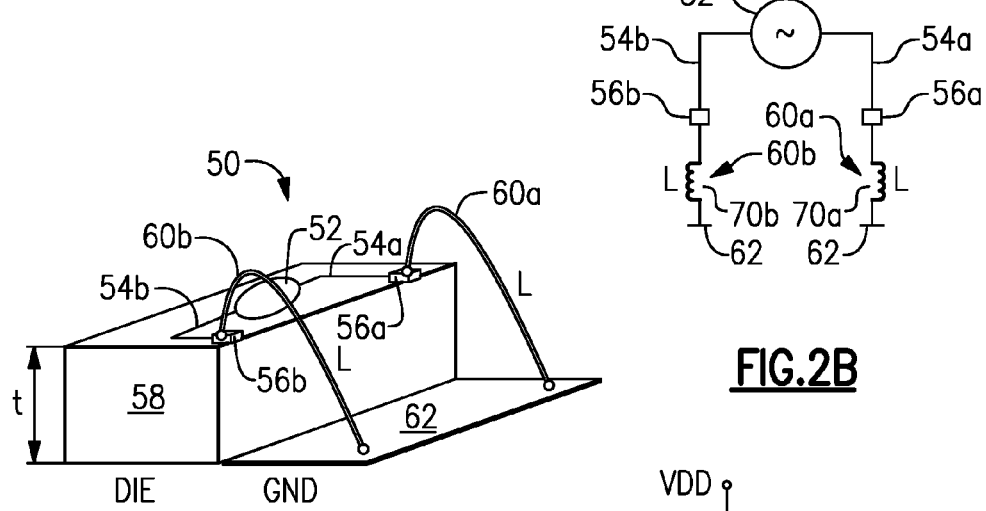
FIG.2A
FIG.2B
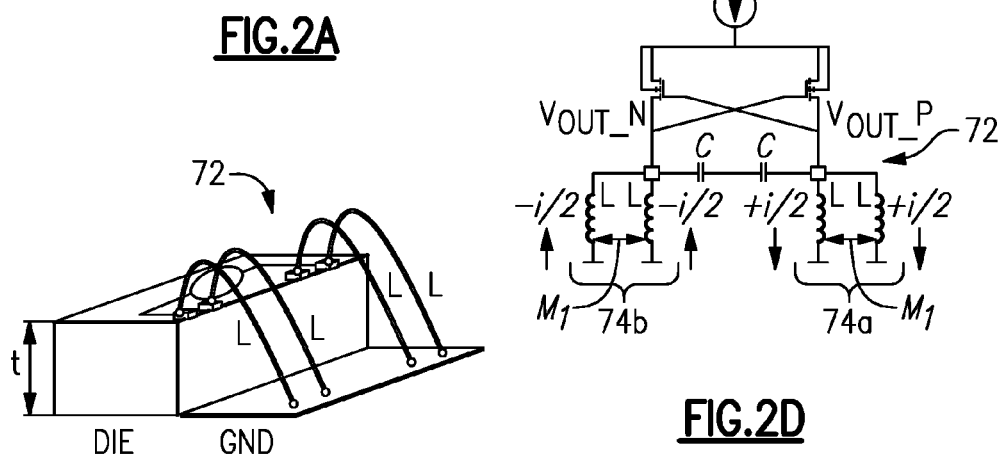
FIG.2C
FIG.2D

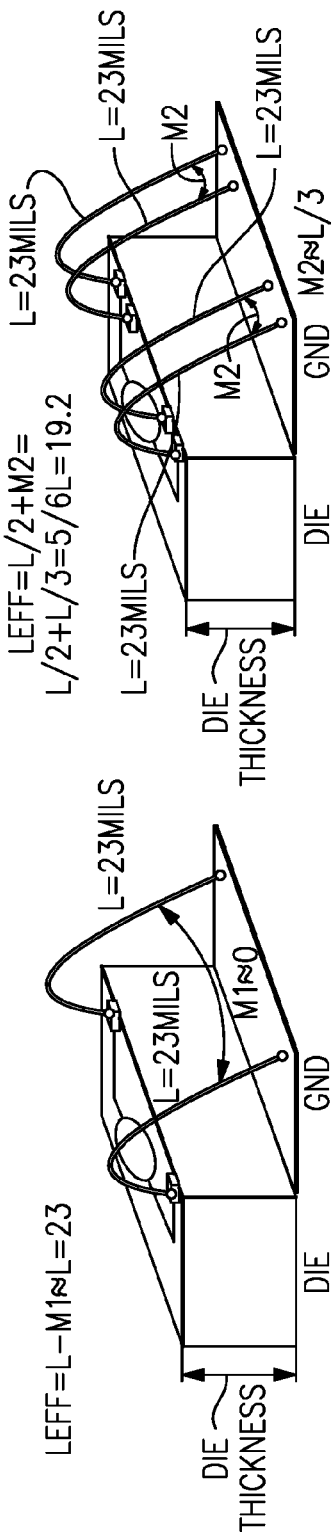
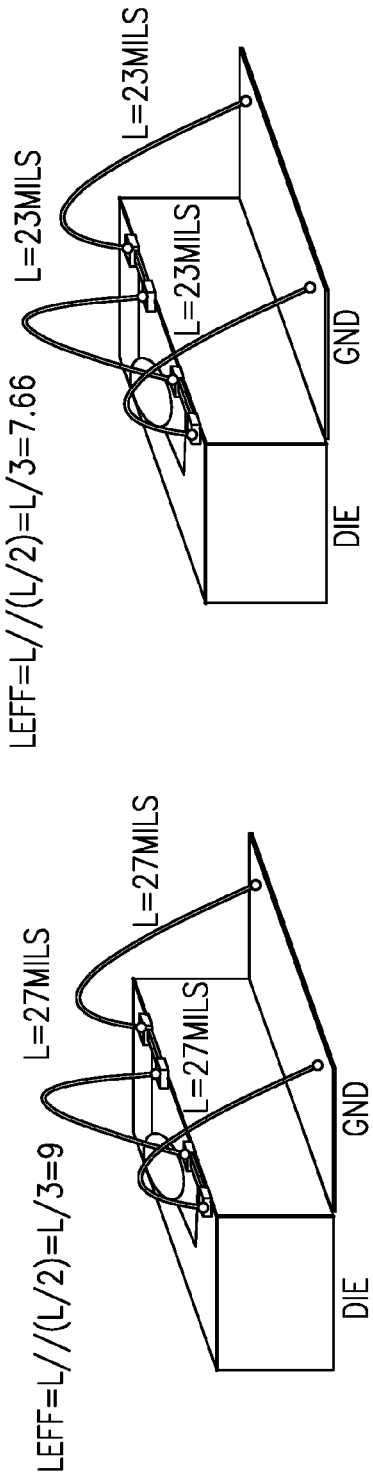
FIG. 7A
FIG. 7B
FIG. 7C
FIG. 7D

CIRCUITS AND METHODS FOR INCREASING OUTPUT FREQUENCY OF AN LC OSCILLATOR

CROSS-REFERENCE TO RELATED APPLICATIONS

This application is a continuation of U.S. patent application Ser. No. 14/717,895, filed May 20, 2015, which is a continuation of U.S. patent application Ser. No. 13/715,018, filed Dec. 14, 2012, now U.S. Pat. No. 9,065,382, issued on Jun. 23, 2015, which claims priority to U.S. Provisional Application No. 61/576,674 filed Dec. 16, 2011 and entitled "CIRCUITS AND METHODOLOGIES FOR INCREASING OUTPUT FREQUENCY OF AN LC OSCILLATOR." The disclosures of each of the foregoing applications are expressly incorporated by reference herein in its entirety.

BACKGROUND

Field

The present disclosure generally relates to circuits and methods for increasing an output frequency of an LC oscillator.

Description of the Related Art

Oscillators generate repetitive oscillating signals that are useful for applications such as in radio-frequency (RF) systems. A given oscillator typically has lower and upper limits in its operating frequency.

In some implementations, an oscillator can be based on an LC circuit that includes an inductance (L) element and a capacitance (C) element. Such an LC circuit can reach a resonance state having a frequency $$f = \frac{1}{2\pi\sqrt{LC}}.$$

Such a resonance frequency can be utilized for a number of RF applications, including, for example, tuning.

SUMMARY

In some implementations, the present disclosure relates to a radio-frequency (RF) module that includes a packaging substrate configured to receive a plurality of components. The packaging substrate is further configured to receive and connect a plurality of wirebonds to a common electrical potential. The module further includes a die mounted on the substrate. The die includes an oscillator circuit that includes differential outputs. The die further includes first and second bond pads electrically connected to the differential outputs. The module further includes a first wirebond that connects the first bond pad and the common electrical potential of the packaging substrate. The first wirebond has an inductance of L1. The module further includes a second wirebond that connects the second bond pad and the common electrical potential of the packaging substrate. The second wirebond has an inductance of L2. The first and second wirebonds are electrically parallel. The apparatus further includes a third wirebond that electrically connects the first and second bond pads. The third wirebond has an inductance of L3. The first, second and third wirebonds in combination has an inductance L" that is lower than an inductance L' corresponding to a combination of L1 and L2 without L3.

In some embodiments, the first and second wirebonds can define respective first and second planes that are approximately parallel to each other. The third wirebond can define a plane that is approximately perpendicular to each of the first and second so as to yield a reduced mutual inductance between the third wirebond and the parallel first and second wirebonds. The first, second and third wirebonds can be configured to yield an approximate electrical symmetry between the first and second bond pads, such that the third wirebond can be represented by two inductances in series with an AC ground in between, with each of the two inductances having a value of approximately half of L3. In some embodiments, each of L1, L2 and L3 can have a value of approximately equal to L, such that L" is approximately equal to L/3.

In some embodiments, the reduced inductance L" can yield an increase in a maximum frequency of the oscillator by a multiplicative factor as large as about sqrt(3) compared to a maximum frequency without the third wirebond.

In some embodiments, the third wirebond having both of its ends positioned on the die can result in L3 being substantially unaffected by variations in placement of the die on the substrate. In some embodiments, the common electrical potential includes a ground potential.

In some embodiments, the oscillator can be a voltage controlled oscillator (VCO. In some embodiments, each of the first, second and third wirebonds can include gold.

According to a number of implementations, the present disclosure relates to a frequency synthesizer that includes a voltage controlled oscillator (VCO) circuit having differential outputs through first and second electrically parallel conductors and a third conductor configured to electrically connect the differential outputs. The first, second and third conductors in combination has an inductance that is lower than an inductance corresponding to a combination of the first and second conductors alone. The lowered inductance yields an increase in a maximum frequency of the VCO circuit. The frequency synthesizer further includes a divider circuit configured to receive a signal from the VCO circuit and output one or more divided-frequency signals. The increased maximum-frequency of the VCO circuit allows greater flexibility in selecting a desired frequency among the one or more divided-frequency signals.

In some embodiments, each of the first, second and third conductors can include a wire. The wire can be in a wirebond form.

In a number of implementations, the present disclosure relates to a cellular base station system that includes a frequency synthesizer. The frequency synthesizer includes a voltage controlled oscillator (VCO) circuit having differential outputs through first and second electrically parallel conductors and a third conductor configured to electrically connect the differential outputs. The first, second and third conductors in combination has an inductance that is lower than an inductance corresponding to a combination of the first and second conductors without the third conductor. The lowered inductance yields an increase in a maximum frequency of the VCO circuit.

In some implementations, the present disclosure relates to a portable wireless device that includes an antenna configured to receive a radio-frequency (RF) signal, and a receiver circuit connected to the antenna and configured to process the received RF signal. The wireless device further includes a voltage controlled oscillator (VCO) circuit coupled to and configured to facilitate operation of the receiver circuit. The VCO has differential outputs through first and second electrically parallel conductors, and a third conductor configured to electrically connect the differential outputs. The first, second and third conductors in combination has an inductance that is lower than an inductance corresponding to a combination of the first and second conductors without the third conductor. The lowered inductance yields an increase in a maximum frequency of the VCO circuit.

In some embodiments, the wireless device can further include a transmitter circuit configured to generate an RF signal to be translated. The VCO can be further coupled to and configured to facilitate operation of the transmitter circuit. The antenna can be further connected to the transmitter circuit and configured to transmit the RF signal generated by the transmitter circuit. In some embodiments, the wireless device can be a cellular phone.

In accordance with some implementations, the present disclosure relates to a method for fabricating a VCO based device. The method includes providing an LC oscillator circuit having differential outputs. The method further includes forming a conductive path between each of the differential outputs and a ground. The method further includes forming a conductive path between the differential outputs, such that the first, second and third conductive paths in combination yields an inductance that is lower than an inductance corresponding to a combination of the first and second conductive paths without the third conductive path. The lowered inductance yields an increase in a maximum frequency of the LC oscillator circuit.

In some embodiments, the method can further include mounting the LC oscillator circuit on a packaging substrate. In some embodiments, the LC oscillator circuit and the differential outputs can be formed on a die, and the ground can be part of the packaging substrate. In some embodiments, each of the first, second and third conductive paths can include a wirebond.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 1 schematically depicts a device that includes a voltage controlled oscillator (VCO) having differential output terminals connected in parallel to a ground.

FIG. 2A shows an example where the differential output terminals of FIG. 1 can be connected in parallel to the ground by wirebonds.

FIG. 2B show an example circuit that can represent the example configuration of FIG. 2A.

FIG. 2C shows another example where the differential output terminals of FIG. 1 can be connected in parallel to the ground by wirebonds.

FIG. 2D show an example circuit that can represent the example configuration of FIG. 2C.

FIGS. 7A-7D show examples of how one or more design factors can influence an effective inductance and oscillation frequency.

DETAILED DESCRIPTION OF SOME EMBODIMENTS

Figure 3:
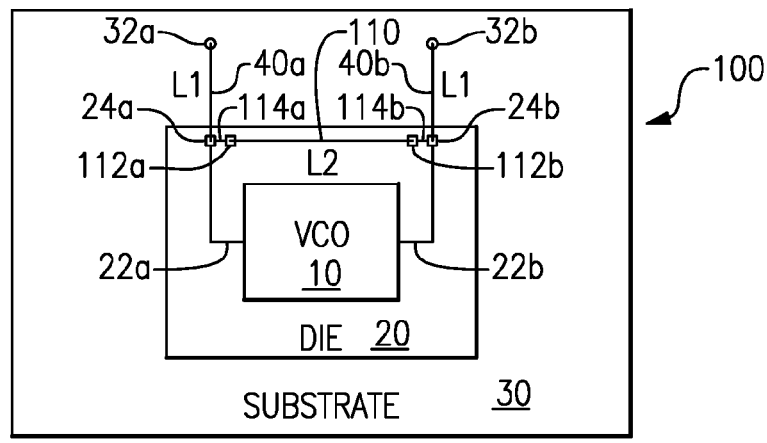
FIG. 3 shows that in some implementations, a conductor such as a wire can be provided between the differential output terminals so as to further reduce an effective inductance associated with the VCO.

The headings provided herein, if any, are for convenience only and do not necessarily affect the scope or meaning of the claimed invention.

The present disclosure is described in the context of LC circuits in high frequency voltage controlled oscillators (VCO) implemented in radio-frequency integrated circuit (RFIC) designs. However, it will be understood that one or more features of the present disclosure can also be implemented in other applications.

In RFIC designs, there is a need to generate high frequency signals from one or more VCOs. A high frequency VCO can utilized for generating lower frequencies by, for example, dividing by N and achieving a corresponding phase noise improvement of 20 log N in dB.

By way of an example, suppose that a wide band frequency synthesizer has a design where the ratio of a maximum VCO frequency (Fmax) divided by the minimum VCO frequency (Fmin) is desired to be at least 2 to provide a substantially continuous wide band frequency coverage. In such a design, if the minimum VCO frequency (Fmin) is centered around 3 GHz, the maximum VCO frequency (Fmax) should be at least 6 GHz. By implementing one or more features of the present disclosure, Fmax can be made to exceed the 6 GHz target and be increased to above 7 GHz. Additional details about such an example of performance improvement are described herein in greater detail.

FIG. 1 schematically shows a device having a VCO 10 formed on a die 20. In some embodiments, such a device can be a packaged device such as a packaged radio-frequency (RF) module. The die 20 can be mounted on a substrate 30. In the context of the example RF module, the substrate 30 can be a packaging substrate such as a laminate substrate.

In some embodiments, a differential LC tank oscillator circuit commonly implemented in such a VCO can be configured such that, for a given capacitance C, the highest VCO frequency is typically achieved when inductance L is minimized. In some situations, such inductance can be proportional to the length of a wire (e.g., a wirebond) from a VCO connection pad to a ground. Thus, reducing the length of such a wire can be desirable for reducing the inductance.

Referring to FIG. 1, a first wire 40a is depicted as connecting a first output 22a of the VCO 10 to the ground between a first output terminal 24a and a first ground terminal 32a. Similarly, a second wire 40b is depicted as connecting a second output 22b of the VCO 10 to the ground between a second output terminal 24b and a second ground terminal 32b. In some embodiments, the wires (40a, 40b) can have a similar or substantially same inductance value L1. In some embodiments, the wires (40a, 40b) can be approximately parallel to each other.

Reducing the lengths of the wires 40a, 40b can decrease the inductance associated with the VCO and thereby increase the highest achievable VCO frequency. In some embodiments, the reduction of wire length (and thus a decreased or minimum inductance L achievable by the wires 40a, 40b) can be limited by physical dimensions associated with a die on which one or more VCOs are formed. For example, FIG. 2A shows a perspective view of a device 50 where the wires (40a, 40b) of FIG. 1 can be in the form of wirebonds 60a, 60b. Thus, the first wirebond 60a interconnects a first output pad 56a (which is connected to a first output 54a of a VCO 52) on the upper surface of a die 58 to a ground 62 at a lower location. Similarly, the second wirebond 60b interconnects a second output pad 56b (which is connected to a second output 54b of the VCO 52) to the ground 62. Accordingly, the thickness "t" of the die 58 can affect the total length of each of the wirebonds 60a, 60b. In the present disclosure, the foregoing wirebonds (60a, 60b) and similar wirebonds are sometimes referred to as downbond wires.

In FIG. 2A, each of the wirebonds 60a, 60b is depicted as having an inductance of L. Such a device can be represented by a circuit diagram of FIG. 2B, where the wirebonds 60a, 60b are represented as inductors 70a, 70b, with each having a value of L.

In some situations, mutual inductance can increase the overall inductance associated with the pair of wire inductors. In fact, such an inductance-reduction technique of utilizing a pair of parallel downbond wires typically does not yield an ideal reduced value of L/2.

To further demonstrate why such parallel downbond wires generally do not provide sufficient reduction in effective inductance, FIGS. 2C and 2D show an example four-wire bonding configuration 72 which attempts an L/2 reduction. As shown in FIG. 2D, current in each of the common mode branches (74a, 74b) flows in the same direction, and accordingly, the mutual inductance M is added in the effective inductance calculation. Since the common mode branches are typically close to each other (e.g., around 100 μm), their mutual inductance (M1) can be significant (e.g., about L/3). As a result, the effective inductance which can be expressed as Leff=(L/2+M1) can be approximately equal to ⅚ L (when M1 =L/3), and the corresponding increase in the oscillation frequency is only about 10%, which is not sufficient for some wide band PLL applications.

FIG. 3 schematically shows a device 100 having a VCO 10 formed on a die 20 which is mounted on a substrate 30. The device 100 can further include a pair of conductors (e.g., wires) 40a, 40b connecting a pair of outputs 22a, 22b of the VCO 10 to the ground between their respective output terminals 24a, 24b and ground terminals 32a, 32b, in a manner similar to the example described in reference to FIG. 1. In some embodiments, the wires (40a, 40b) can have a similar or substantially same inductance value L1. In some embodiments, the wires (40a, 40b) can be approximately parallel to each other.

FIG. 3 shows that in some embodiments, the device 100 can include a conductor 110 that electrically connects the first and second outputs 22a, 22b of the VCO 10. In the example shown in FIG. 3, the conductor 110 can be a wire provided between first and second terminals 114a, 114b which are in turn connected (114a, 114b) to the respective output terminals 24a, 24b. Such a wire 110 is depicted as having an inductance of L2. In some embodiments, the value of L2 can be approximately same as L1. In some embodiments, the wire 110 can be approximately perpendicular to each of the wires 40a, 40b.

As described herein, such a configuration can provide a number of desirable properties. For example, the overall inductance can be further reduced to thereby increase the maximum VCO frequency (Fmax). In another example, the VCO's phase noise (PN) performance can also be improved. In yet another example, variation in the VCO's maximum frequency can be made to be less sensitive to assembly errors such as die placement variations. Additional details concerning the foregoing examples are described herein in greater detail.

Figure 4A:
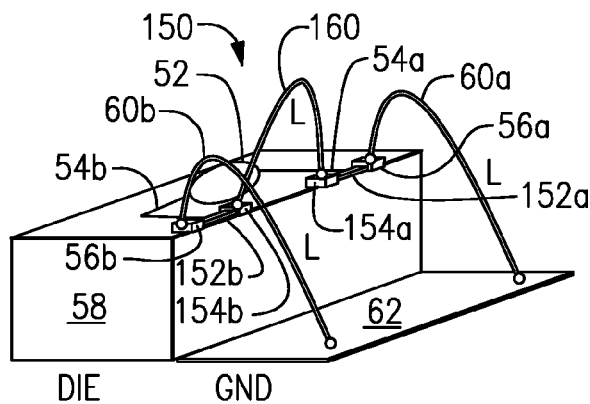
FIG. 4A shows that in some embodiments, the conductor that connects the differential output terminals of FIG. 3 can be a wirebond.

FIG. 4A shows that in some embodiments, a device 150 can be configured so that the wires (40a, 40b) of FIG. 3 can be in the form of wirebonds 60a, 60b. Thus, the first wirebond 60a interconnects a first output pad 56a (that is connected to a first output 54a of a VCO 52) on the upper surface of a die 58 to a ground 62 at a lower location. Similarly, the second wirebond 60b interconnects a second output pad 56b (that is connected to a second output 54b of the VCO 52) to the ground 62. In some embodiments, each of the two wirebonds 60a, 60b can be configured to have an inductance of L. In some embodiments, the two wirebonds 60a, 60b can be configured and oriented so that planes defined by the two wirebonds are approximately parallel.

FIG. 4A shows that in some embodiments, the device 150 can be configured so that the wire 110 of FIG. 3 can be in the form of a wirebond 160. The wirebond 160 can electrically connect the first and second outputs 54a, 54b of the VCO 52. In the example shown in FIG. 4A, the wirebond 160 can be formed between first and second terminals 154a, 154b which are in turn connected (152a, 152b) to the respective output terminals 56a, 56b. In some embodiments, such a wirebond 160 can be configured to have an inductance of L. In some embodiments, the wirebond 160 can be configured and oriented so that a plane defined by it is approximately perpendicular to each of the two planes defined by the wirebonds 60a, 60b.

In example configuration of FIG. 4A, each of the two down-wirebonds 60a, 60b and the third wirebond 160 is depicted as having an inductance of L. Such a device can be represented by a circuit diagram of FIG. 4B, where the wirebonds 60a, 60b, 160 are represented as inductors 70a, 70b, 170, with each having a value of L.

Figure 4B:
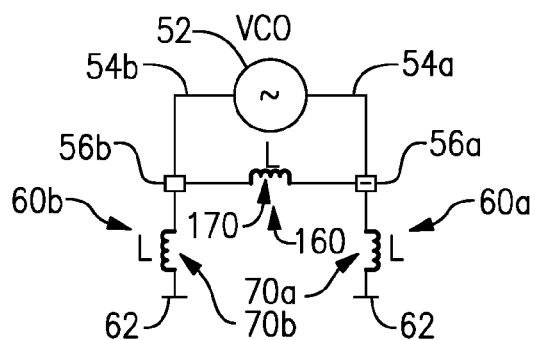
FIG. 4B shows an example circuit that can represent the configuration of FIG. 4A.
Figure 5A:
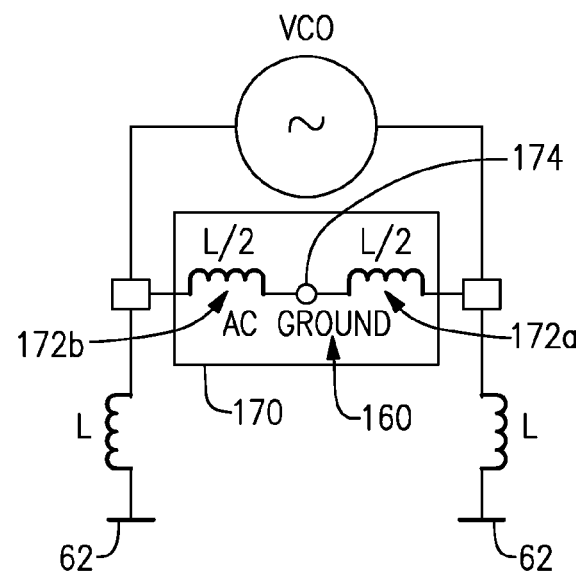
FIG. 5A shows an example circuit that can represent the circuit of FIG. 4B which can be configured to be approximately symmetric such that a middle point of the wire connecting the output terminals acts as an AC ground.
Figure 5B:
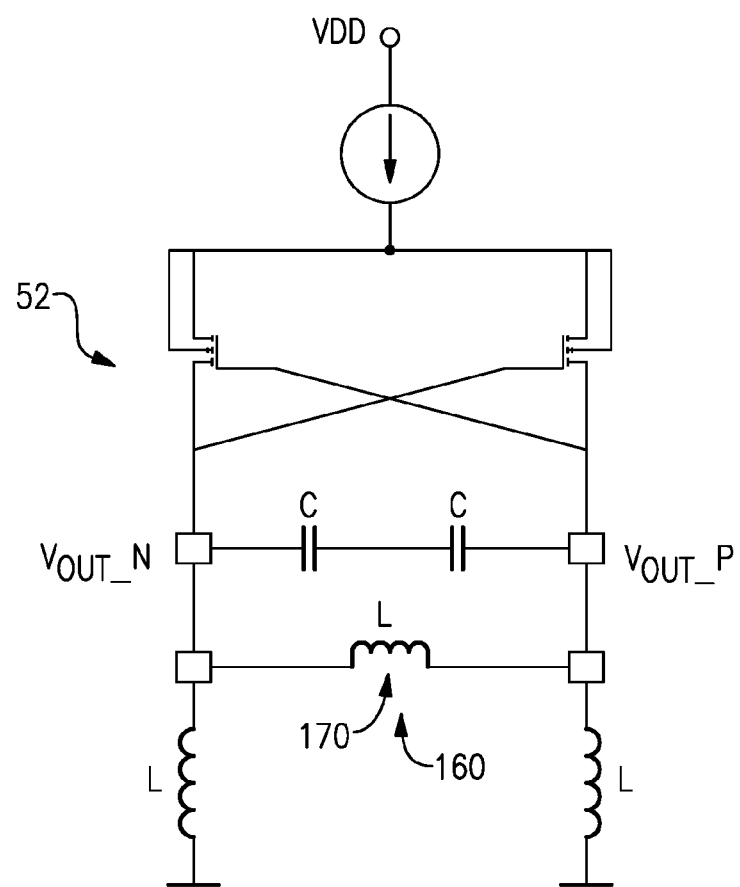
FIG. 5B shows an example of a more detailed schematic of a VCO that can benefit from one or more features as described herein.

In some embodiments where each of the wire inductors 70a, 70b, 170 has an inductance of L, and the third wirebond 170 is approximately perpendicular to both of the down-wirebonds 70a, 70b, the circuit diagram of FIG. 4B can be represented by a circuit shown in FIG. 5A. FIG. 5B shows a more detailed schematic of the VCO that can benefit from one or more features as described herein.

Due to the symmetry of the three wirebonds 70a, 170, 70b, a location (e.g., a mid-location) along the third wirebond 170 can act as or be approximated as an AC ground 174. For example, when VCO outputs undergo small differential changes, such a location of the third wirebond can stay approximately constant and maintain balance, therefore acting as an AC ground. Thus, for the foregoing example configuration, the single wirebond 160 of FIGS. 4A and 4B can be represented as two inductors 172a, 172b (each with an inductance of L/2) with the AC ground 174 in between.

For the foregoing example circuit of FIG. 5A, the inductor assemblies on the left and right sides of the AC ground 174 can be considered to be electrically connected in a parallel manner. For each inductor assembly, the down-wirebond inductance L (70a or 70b) can be considered to be electrically parallel to the half-inductance L/2 (172a or 172b), such that the inductor assembly has an equivalent inductance of L/3.

In the parallel down-wirebonds examples described in reference to FIGS. 2A-2D, the ideal reduced inductance of L/2 is generally not attainable due to mutual inductance. The reduction of inductance by the third wirebond (e.g., 160 in FIGS. 4 and 5), however, is generally not affected by mutual inductance due to the third wirebond 160 being approximately perpendicular to the two down-wirebonds 60a, 60b. Accordingly, mutual inductance associated with the third wirebond 160 generally does not increase the total equivalent inductance. Examples of performance improvements due to the addition of such a third wirebond 160 are described herein in greater detail.

Figure 6:
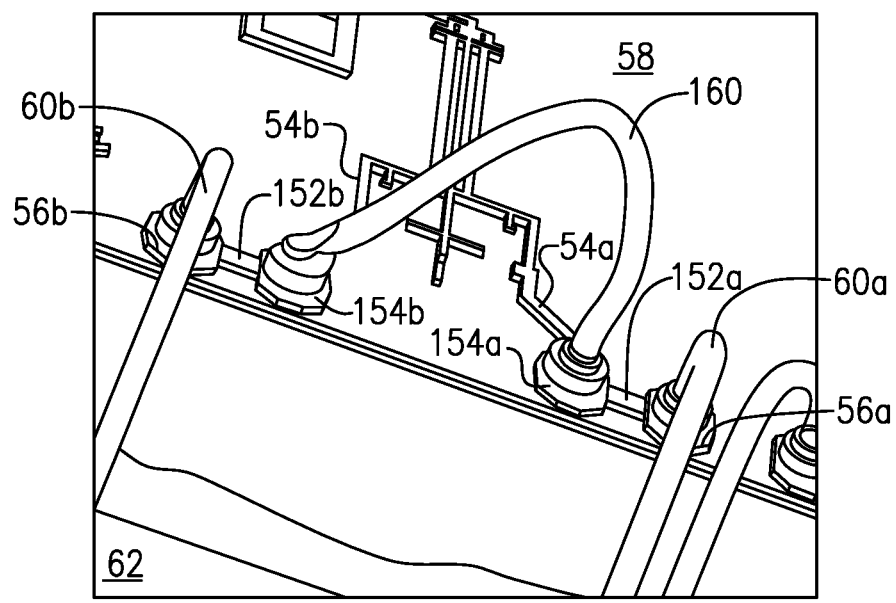
FIG. 6 shows a perspective view of a device having a wirebond that can be formed as a conductor that connects the differential output terminals so as to provide one or more desirable functionalities associated with the configurations of FIGS. 4 and 5.

FIG. 6 shows a perspective view of a device having example wirebonds implemented according to the example circuits of FIGS. 4 and 5. Two down-wirebonds 60a, 60b are shown as being connected to their bond pads 56a, 56b on an upper surface of a die 58. The bond pads 56a, 56b are shown as being connected to the outputs 54a, 54b of a VCO (not shown) via bond pads 154a, 154b. A third wirebond 160 is shown to connect the bond pads 154a, 154b.

In some implementations, the wirebonds shown in FIG. 6 can be formed by a number of known wirebonding techniques utilizing a number of different materials. In the example shown, each of the three wirebonds (60a, 60b, 160) is formed by a gold wire having a diameter of approximately 20 μm.

As described herein, a decrease in the effective inductance of an LC VCO device can increase its maximum frequency of oscillation which can be expressed as $\omega_0=1/\sqrt{L_{min}C}$, where $L_{min}$ represents a minimum achievable inductance, and C is related to the device's effective capacitance. For the example configuration of FIGS. 2A and 2B where a third wirebond is not present, the minimum achievable inductance ($L_{min}^{old}$) is typically higher than the ideal value of L/2. As described herein in reference to FIGS. 4 and 5, where a third wirebond is present, the minimum achievable inductance ($L_{min}$) can be as low as ⅓ of $L_{min}^{old}$ associated with the no-third-wirebond configuration. Accordingly, the maximum frequency of oscillation associated with the configuration of FIGS. 4 and 5 can be as high as $\omega_0^{new}=1/\sqrt{(L_{min}^{old}/3)C}=\sqrt{3}\omega_0^{old}$, or approximately 1.73 times the maximum frequency $\omega_0^{old}$ associated with the no-third-wirebond configuration.

In one example, a wideband integer-N frequency synthesizer with one or more differential VCOs (not having a third wirebond) configured for operation up to about 6.0 GHz can yield a maximum frequency of about 5.4 GHz. For such a device, addition of a third wirebond similar to those described in reference to FIGS. 4-6 can yield a maximum frequency that is higher than 7 GHz, which is an increase by about 30% from $\omega_0^{old}$.

In some implementations, maximum frequencies can also be influenced by other factors and/or designs. By way of non-limiting examples, Table 1 lists different configurations that demonstrate effects of some of these factors. Table 1 refers to four example configurations shown in FIGS. 7A-7D. As described herein, an inductance can be proportional to a length of a wirebond. Thus, it will be understood that the example lengths shown in FIGS. 7A-7D and listed in Table 1 can be proportional to respective inductance values.

FIG. 7A shows a configuration similar to the example described in reference to FIG. 2A, with each wirebond having a minimum achievable length of about 0.600 mm (about 0.023" or 23 mils). Since mutual inductance M1 in this example configuration is substantially nil, an effective inductance is proportional to about 23 mils. For the example configuration of FIG. 7A, an oscillation frequency $F_{osc}$ is observed to be about 4.9 GHz. For the purpose of comparison of different configurations of Table 1 (and FIGS. 7A-7D), such a frequency is designated as being at 100%.

FIG. 7B shows another configuration where each output is connected to ground by two wirebonds, each having a length of about 23 mils. As described herein, such a pair of wirebonds can yield a mutual inductance that is about a third of the inductance of each wirebond. Accordingly, an effective inductance can be proportional to about ⅚ of 23 mils, which is about 19.2 mils. For such a configuration, an oscillation frequency $F_{osc}$ is observed to be about 5.4 GHz which is about 10% higher than the example of FIG. 7A.

FIGS. 7C and 7D show configurations that are similar to the example described in reference to FIG. 4A. In FIG. 7C, each of the wirebonds is shown to have a length of about 27 mils. In FIG. 7D, each of the wirebonds is shown to have a shorter length of about 23 mils. In some embodiments, such shorter wirebonds can be facilitated by a thinner die.

For the 27-mil wirebond example of FIG. 7C, an effective inductance can be proportional to about ⅓ of 27 mils, which is about 9 mils. For such a configuration, an oscillation frequency $F_{osc}$ is observed to be about 7.8 GHz which is about 60% higher than the example of FIG. 7A. It is noted that even with the longer wirebonds (than the examples of FIGS. 7A and 7B), the presence of a wirebond that interconnects the VCO outputs greatly reduces the effective inductance and thereby increases the oscillation frequency.

Compared to the 27-mil wirebond example of FIG. 7C, the 23-mil wirebond example of FIG. 7D is shown to have an effective inductance that is proportional to about ⅓ of 23 mils, which is about 7.66 mils. For such a configuration, an oscillation frequency $F_{osc}$ is observed to be about 8.5 GHz which is about 73% higher than the example of FIG. 7A.

As described in the foregoing examples, one can see that the thickness of a die can dictate the minimum length of the grounding wirebonds. Thus, in some implementations, a wirebonding configuration can be achieved so as to account for the die thickness, a minimum loop height requirement, and/or lateral displacement of the ground connection so as to yield a desired effective inductance.

TABLE 1

| Example configuration | Wirebond lengths (mils) proportional to effective inductance (approximate) | $F_{osc}$ (GHz) (approximate) | $F_{osc}$ (%) (approximate) |
| --- | --- | --- | --- |
| FIG. 7A | 23 | 4.9 | 100% |
| FIG. 7B | 19.2 | 5.4 | 110% |
| FIG. 7C | 9 | 7.8 | 160% |
| FIG. 7D | 7.66 | 8.5 | 173% |

In some implementations, another performance parameter that can benefit from or along with the increased maximum frequency is a VCO's phase noise (PN). Such noise can be expressed as a frequency-dependent function $$PN(\omega) = 10 \text{ Log}((2kT\omega_0 F)/(V_0^2 C Q \omega^2)) \quad (1)$$

with $\omega_0$ being the frequency of oscillation and $\omega$ being the frequency offset at which the phase noise is measured. The frequency of oscillation can be represented as $\omega_0 = 1/\sqrt{(L*C)}$ and it generally will not change if $L^{new} = (L/k)$ and $C^{new} = (C*k)$ where k is a real number. Maintaining the frequency of oscillation $\omega_0$ by reducing L and proportionally increasing C can lead to an improved phase noise performance based on Equation 1, assuming constant $V_0$ and Q. In some embodiments, improvement can be $PN^{new}(\omega) = PN^{old}(\omega) - 10 \text{ Log}(k)$. Since the examples described herein allow k=3 (3 times reduction in L, and 3 times increase in C for the same $\omega_0$), the maximum phase noise improvement can be 10 log(3) or 4.77 dB.

Figure 8:
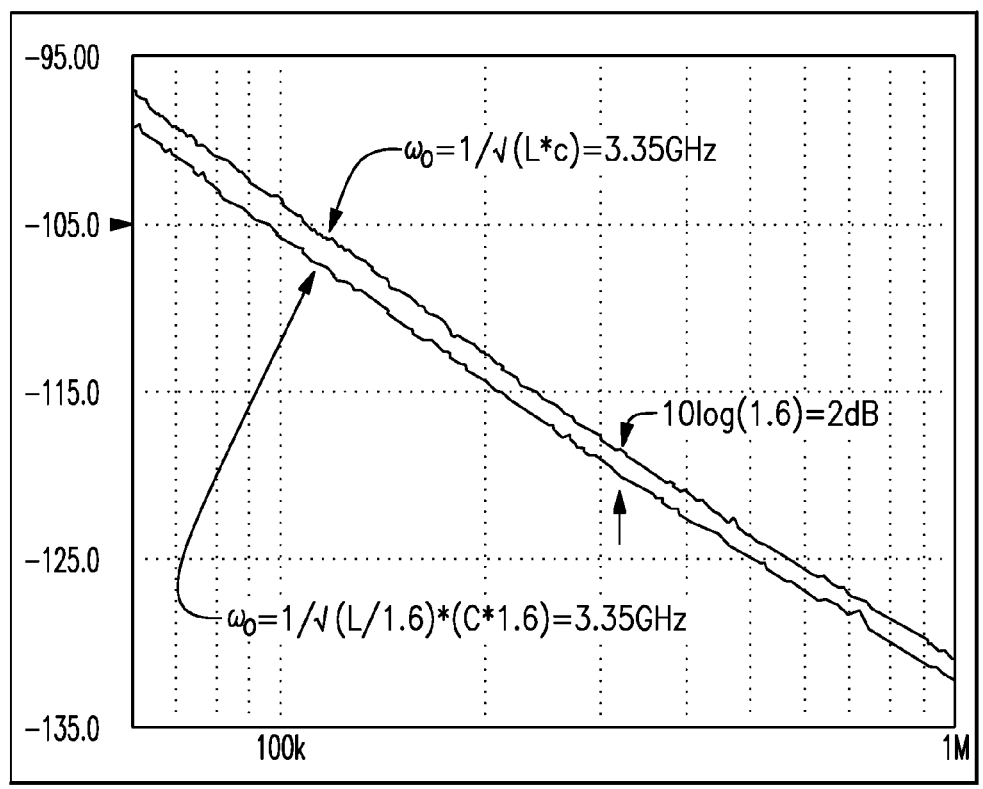
FIG. 8 show an example of an improvement in VCOs phase noise that can be achieved based on one or more features described herein.

FIG. 8 shows an example of such an improvement. In the example shown, measurements show an improvement of about 2 dB in phase noise performance for an example setting where $\omega_0 = 3.35$ GHz and k=1.6.

Figures 9A, 9B:
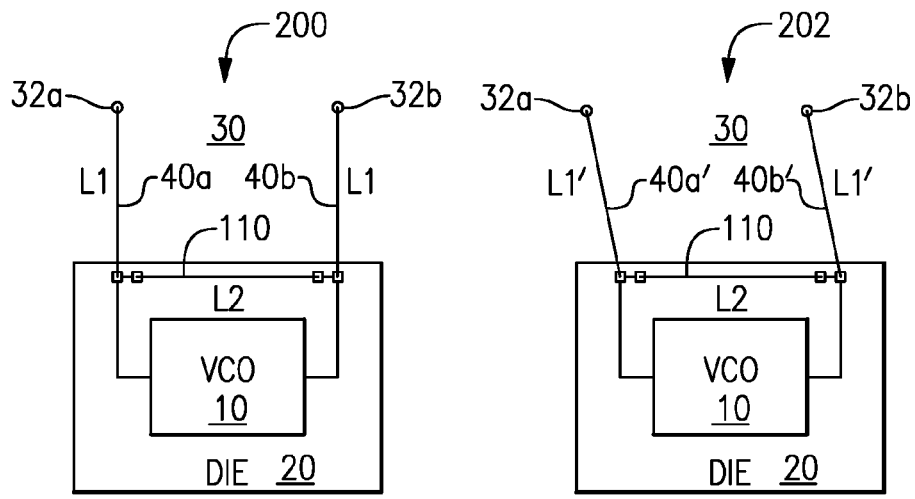
FIGS. 9A and 9B show an example of how the configurations of FIGS. 4 and 5 can desirably reduce variation in operating frequency.

FIGS. 9A and 9B show that in some implementations, a device having a configuration similar to those examples of FIGS. 4-6 can be less susceptible to performance variations resulting from assembly variations. For example, FIG. 9A depicts an example configuration 200 where each of down-wires 40a, 40b interconnects its respective VCO output pad (on a die 20) and ground pad (32a or 32b, on a substrate 30) that are at desired separation and relative orientation (e.g., so that the two down-wires 40a, 40b are approximately parallel). In such a configuration, a third wire 110 formed on the die 20 can desirably perpendicular to each of the down-wires 40a, 40b to reduce the mutual inductance effect.

Suppose, however, that an assembly tolerance results in the die being mounted at a displaced location and/or in a wrong orientation relative to the foregoing desired location and orientation. For example, FIG. 9B shows an example configuration where the die 20 displaced laterally relative to the ground pads 32a, 32b. Accordingly, each of the two down-wires 40a', 40b' will likely have a new length that is longer than the desired length of FIG. 9A. Such an increase in length will likely result in the new inductance L1' being greater than the desired inductance L1 of FIG. 9A so as to degrade the maximum-frequency performance provided by the two down-wires.

As described herein, the third wire 110 is generally not susceptible to the foregoing variations between the die 20 and the substrate 30, since it can be formed on the same die 20. While the displaced configuration of FIG. 9B may slightly increase the mutual inductance between the third wire 110 and the two down-wires (40a', 40b'), the reduction in total inductance provided by the third wire 110 is generally not affected (or is affected minimally) by the displacement. In some implementations, it is estimated that for a no-third-wire configuration having a maximum-frequency variation of about 5% resulting from the foregoing die placement variation, addition of the third wire can reduce such a variation to about 1.5%.

Figure 10A:
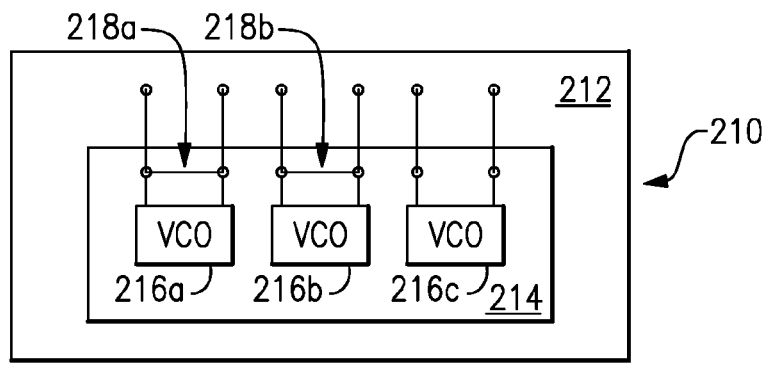
FIGS. 10A and 10B show non-limiting examples of how one or more features associated with the configurations of FIGS. 4 and 5 can be implemented.
Figure 10B:
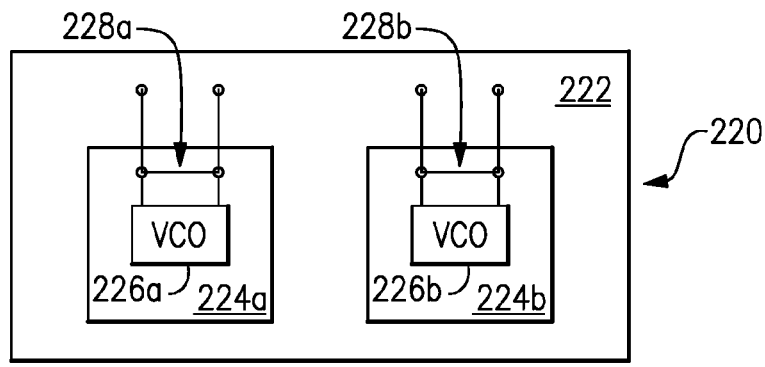

FIGS. 10A and 10B show non-limiting examples of how one or more features of the present disclosure can be implemented in a device. FIG. 10A shows that in some embodiments, a device 210 can include a plurality of VCOs (216a, 216b, 216c) formed on a same die 214. Such a die can be mounted on a substrate 212. Outputs of each of the VCOs can be connected to a common ground by a pair of down-wires as described herein. Some or all of such VCOs can include a third wire that interconnects the VCO outputs as described herein. In the example shown in FIG. 10A, the VCOs 216a and 216b are configured as such with wires 218a and 218b, and the VCO 216c is depicted as not having such a third wire. Other configurations are also possible.

FIG. 10B shows that in some embodiments, a device 220 can include a plurality of dies 224a, 224b mounted on a substrate 222. Each of such dies can include one or more VCOs having a third wire. In the example shown in FIG. 10B, the die 224a having a VCO 226a includes a third wire 228a; and the die 224b having a VCO 226b includes a third wire 228b. Other configurations are possible.

Figure 11:
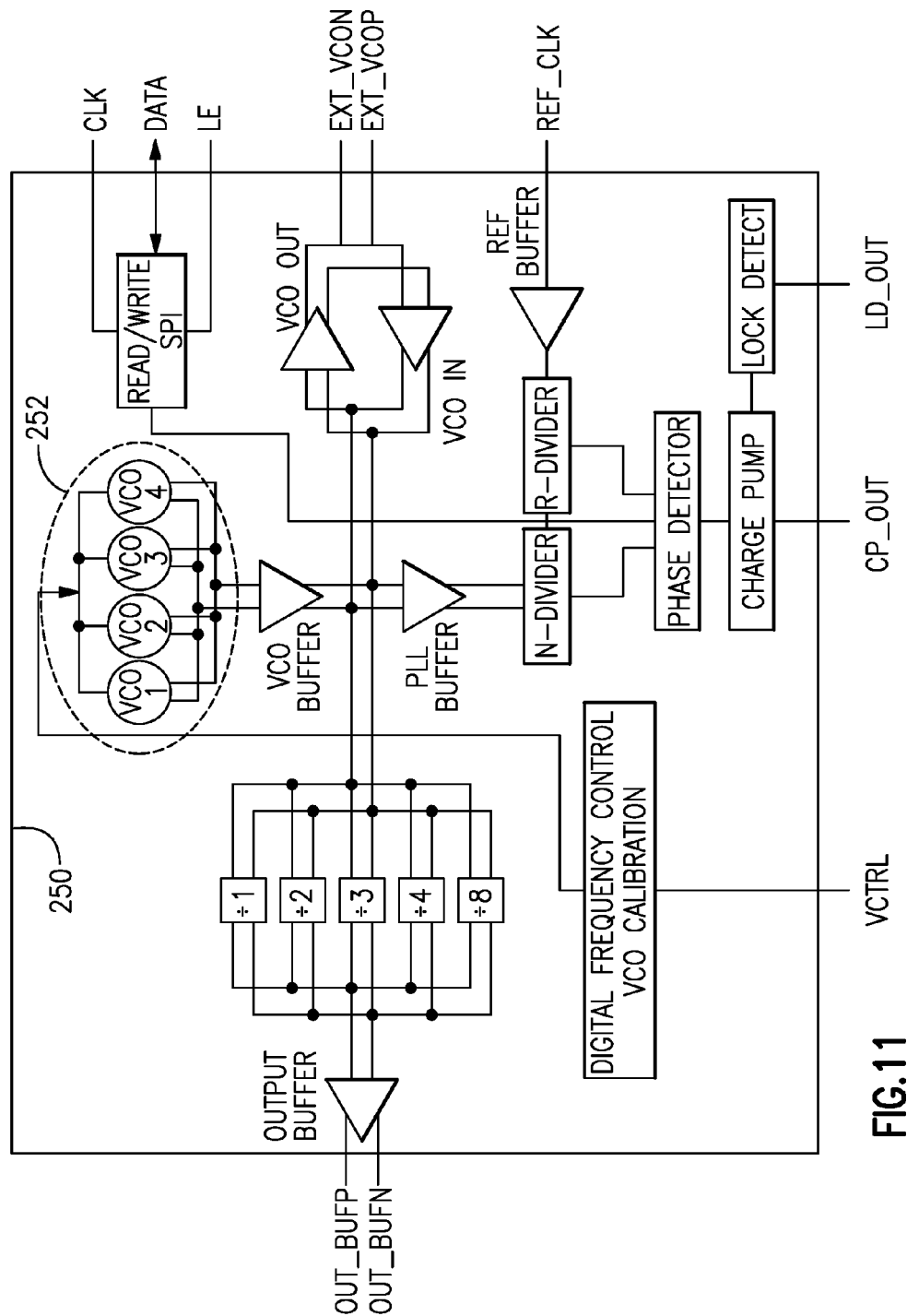
FIG. 11 shows an example of a modular device in which one or more features as described herein can be implemented.

FIG. 11 shows that in some implementations, one or more VCOs whose outputs are configured with one or more features as described herein can be included in a number of devices such as modules or chips. An example device 250 shown is a wideband integer-N frequency synthesizer having four VCOs 252 which cover an ideal output range from about 2.8 GHz to about 6.0 GHz. By applying internal VCO division by 1, 2, 3, 4 or 8, the output frequency range can be broadened to be from about 0.35 GHz to about 6.4 GHz.

Figure 12A:
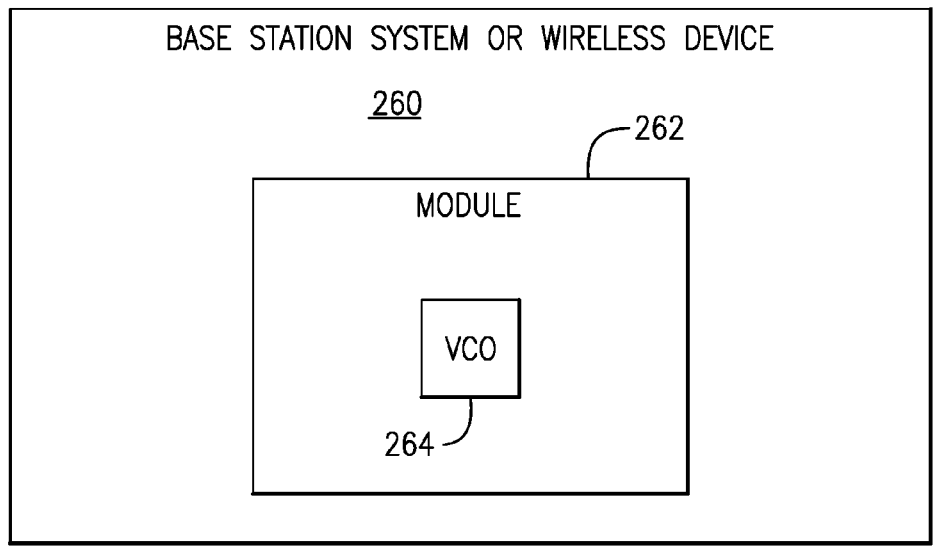
FIG. 12A schematically depicts an example of a product or a system in which one or more features as described herein can be implemented.

FIG. 12A shows that one or more features described herein can be implemented in a number of devices or systems. Such devices or systems can include a base station system or a wireless device 260. Such a system or a device can include one or more modules 262 (e.g., a frequency synthesizer module) having one or more VCOs 264. At least some of such VCOs can be configured to include a third wire described herein so as to desirably increase its maximum frequency and also provide other desirable performance features.

Figure 12B:
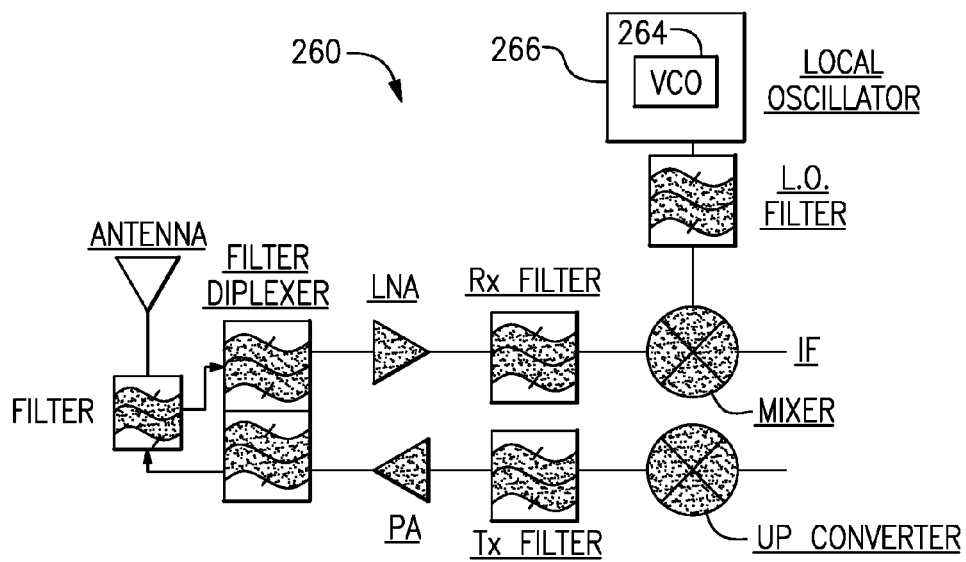
FIG. 12B schematically depicts a base station system having one or more features of the present disclosure.

FIG. 12B schematically depicts an example base station system 260. The system 260 is shown to include a local oscillator (LO) 266 having one or more VCOs 264. At least some of the one or more VCOs 264 can include one or more features associated with a third wire that provides desirable performance features. An oscillator signal from the LO 266 is shown to be provided to an intermediate frequency (IF) mixer (via an LO filter) for processing of a received RF signal. The LO can also provide an oscillator signal to an upconverter mixer for an RF signal to be transmitted.

In the example of FIG. 12B, the received RF signal input into the IF mixer can originate from an antenna, filtered, passed through a diplexer, and be amplified by a low-noise amplifier (LNA). In the example shown, the LNA-amplified RF signal is shown to pass through an RX filter before being provided to the mixer.

In the example of FIG. 12B, the RF signal to be amplified from the upconverter can be passed through a TX filter before being provided to a power amplifier (PA). The amplified RF signal can then be passed through a diplexer and be filtered before being provided to the antenna for transmission.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12C:
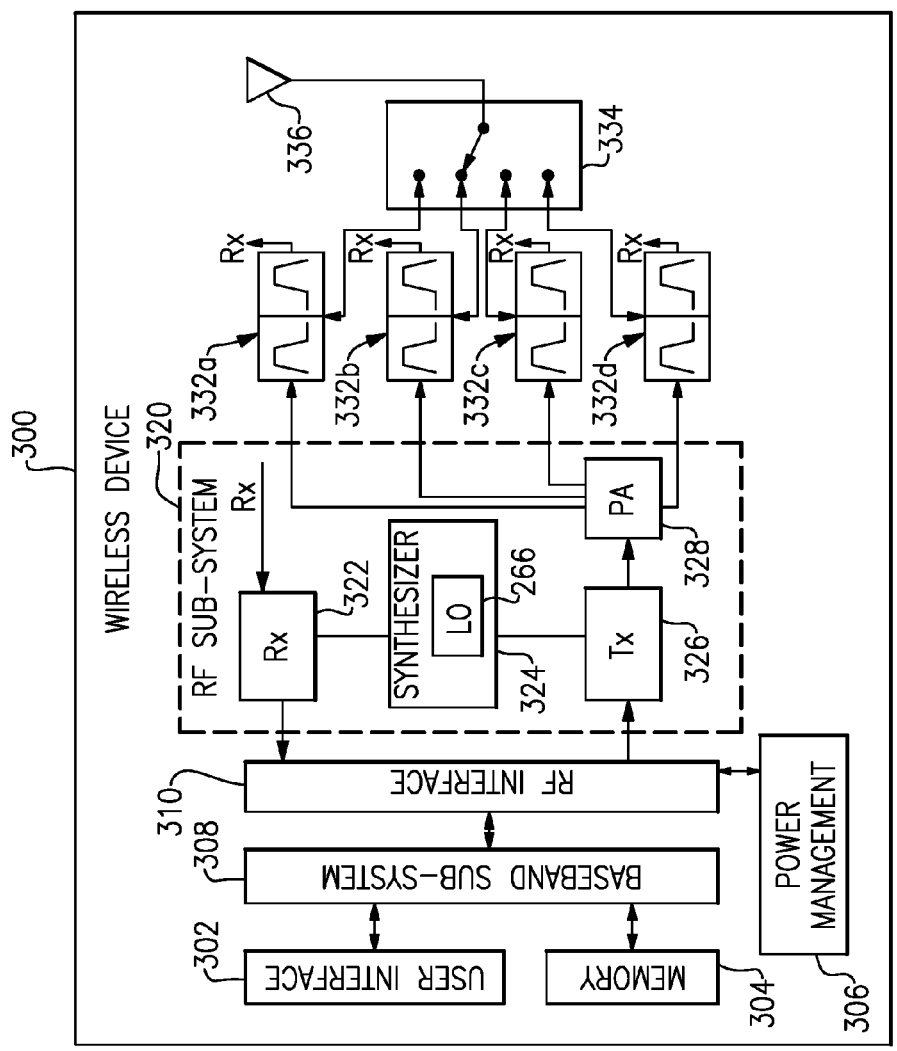
FIG. 12C schematically depicts a wireless device having one or more features of the present disclosure.

FIG. 12C schematically depicts an example wireless device 300 having one or more advantageous features described herein. The example shown in FIG. 12C is for a frequency-division duplexing (FDD) configuration; however, it will be understood that a wireless device having a time-division duplexing (TDD) configuration can also include and benefit from one or more features as described herein.

In the example wireless device 300 of FIG. 12C, an RF sub-system 320 can include a receiver circuit 322 and a transmitter circuit 326. Either or both of such RF circuits can be provided with one or more signals from a synthesizer 324 having a local oscillator 266. Such a local oscillator can include one or more VCOs having one or more advantageous features described herein.

In the example shown, the receiver 322 can be provided with a received (Rx) signal originating from an antenna 336 and routed through a switch 334 and a duplexer 332. Such a received signal can be amplified by an LNA (not shown) before being provided to the receiver 322.

In the example shown, the transmitter 326 can generate an RF signal to be transmitted, and such an RF signal can be amplified by a power amplifier (PA) 328. Such an amplified RF signal can be routed to the antenna 336 through the duplexer 332 and the switch 334.

The transmitter 326 and the receiver 322 are shown to interact with a baseband sub-system 308 through an RF interface 310. The baseband sub-system can be configured to provide conversion between data and/or voice signals suitable for a user and RF signals associated with the transmitter 326 and the receiver 322. The RF interface 310 is also shown to be connected to a power management component 306 that is configured to manage power for the operation of the wireless device 300. Such power management can also control operations of the baseband sub-system 308 and other components or sub-systems.

The baseband sub-system 308 is shown to be connected to a user interface 302 to facilitate various input and output of voice and/or data provided to and received from the user. The baseband sub-system 308 can also be connected to a memory 304 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 13:
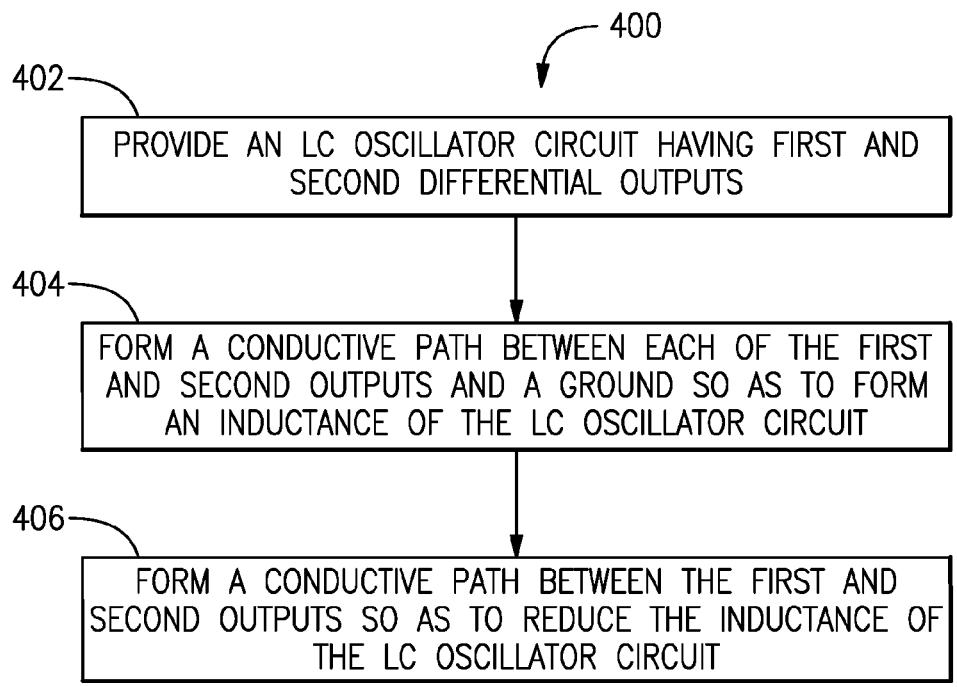
FIG. 13 shows a process that can be implemented to fabricate a device having one or more features as described herein.

FIG. 13 shows a process 400 that can be implemented to fabricate a device having a feature described herein by way of a third wire (e.g., a third wirebond). In block 402, an LC oscillator circuit having first and second differential outputs can be provided. In block 404, a conductive path can be formed between each of the first and second outputs and a ground so as to reduce an effective inductance of the LC oscillator circuit. In block 406, a conductive path can be formed between the first output and the second output so as to further reduce the effective inductance of the LC oscillator circuit.

Figure 14:
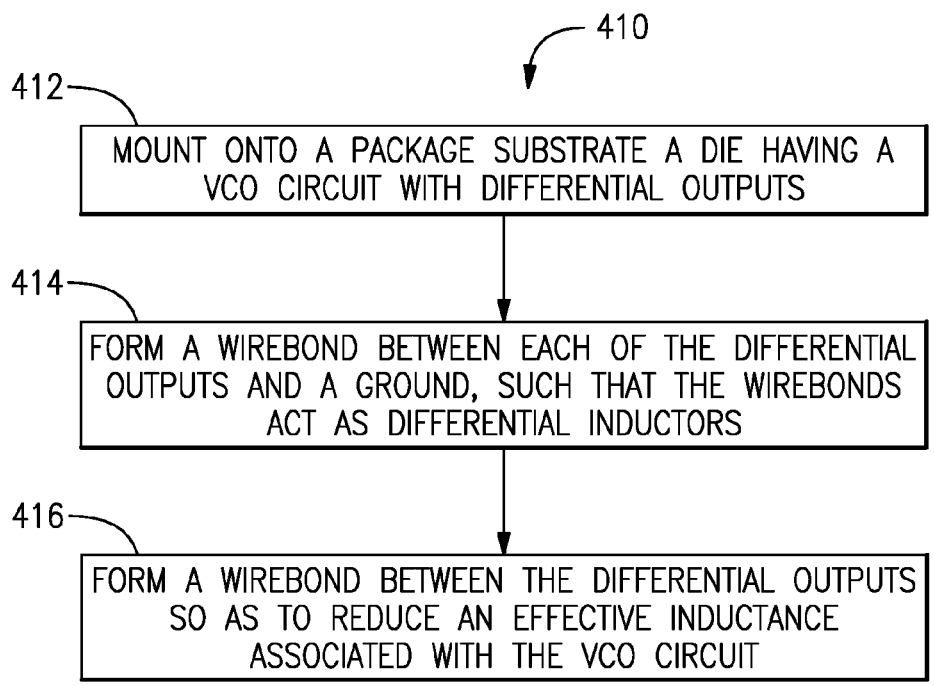
FIG. 14 shows a process that can be implemented as a more specific example of the process of FIG. 13.

FIG. 14 shows a process 410 that can be implemented as a more specific example of the process 270 of FIG. 13. In block 412, a die having a VCO circuit with differential outputs can be mounted onto a package substrate. In block 414, a wirebond can be formed between each of the differential outputs and a ground, such that the resulting wirebonds act as parallel inductors that reduce an effective inductance of the VCO circuit. In block 416, a wirebond can be formed between the differential outputs so as to further reduce the effective inductance of the VCO circuit.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
a substrate;
a die mounted on the substrate, the die including an oscillator circuit connected to first and second output terminals that are formed on an upper surface of the die;
a first pair of conductors connecting the first output terminal and a common electrical potential of the substrate; and
a second pair of conductors connecting the second output terminal and the common electrical potential of the substrate, the first and second pair of conductors being spaced from one another, the first and second pair of conductors extending along approximately parallel planes relative to each other, the first pair of conductors spaced apart from each other by a first distance, the second pair of conductors spaced apart from each other by a second distance, and the first pair of conductors spaced from the second pair of conductors by a third distance that is greater than the first distance or second distance.

2. The radio-frequency module of claim 1 wherein the first and second pair of conductors extend along parallel planes relative to each other.

3. The radio-frequency module of claim 1 wherein each of the first pair of conductors and second pair of conductors extend to a height above the substrate that is greater than a thickness of the die such that an apex of each of the first pair of conductors and second pair of conductors is spaced above the upper surface of the die.

4. The radio-frequency module of claim 1 wherein each of the first pair of conductors and second pair of conductors have an inductance approximately equal to L, such that a reduced inductance L" of the oscillator circuit is approximately equal to $\tfrac{5}{6}$ L.

5. The radio-frequency module of claim 1 wherein a reduced inductance L" of the oscillator circuit yields an increase in a maximum frequency of the oscillator circuit by approximately 10%.

6. The radio-frequency module of claim 1 wherein each of the first pair of conductors and the second pair of conductors extends upward from the upper surface of the die and then downward to the substrate.

7. The radio-frequency module of claim 6 wherein each of the first pair of conductors and the second pair of conductors has a curved configuration along at least a portion of its length.

8. The radio-frequency module of claim 1 wherein the common electrical potential includes a ground.

9. The radio-frequency module of claim 1 wherein the oscillator is a voltage controlled oscillator.

10. The apparatus of claim 9 wherein the voltage controlled oscillator is part of a frequency synthesizer circuit formed on the die.

11. A wireless device comprising:
an antenna configured to receive a radio-frequency signal;
a receiver circuit connected to the antenna and configured to process the received RF signal; and
a voltage controlled oscillator circuit residing on a die mounted on a substrate coupled to and configured to facilitate operation of the receiver circuit, the voltage controlled oscillator circuit connected to first and second output terminals on the die, a first pair of conductors and a second pair of conductors connecting the first and second output terminals to the substrate, respectively, the first pair of conductors spaced apart from the second pair of conductors, the first and second pair of conductors in combination having an inductance L" that is lower than an inductance corresponding to each of the conductors, each of the first pair of conductors and second pair of conductors extending to a height above the substrate that is greater than a thickness of the die such that an apex of each of the first pair of conductors and second pair of conductors is spaced above the upper surface of the die.

12. The wireless device of claim 11 further comprising a transmitter circuit configured to generate a radio frequency signal to be translated, the voltage controlled oscillator circuit being further coupled to and configured to facilitate operation of the transmitter circuit.

13. The wireless device of claim 12 wherein the antenna is further connected to the transmitter circuit and configured to transmit the RF signal generated by the transmitter circuit.

14. The wireless device of claim 11 wherein the wireless device is a cellular phone.

15. The wireless device of claim 11 wherein each of the first pair of conductors and second pair of conductors have an inductance approximately equal to L, such that the reduced inductance L" of the oscillator circuit is approximately equal to $\tfrac{5}{6}$ L.

16. The wireless device of claim 11 wherein the first and second pair of conductors extend along approximately parallel planes relative to each other.

17. A method for fabricating a voltage controlled oscillator based device, the method comprising:
providing an inductor-capacitor oscillator circuit formed on a die and having first and second differential outputs electrically connected to first and second output terminals formed on the die;
mounting the die having the inductor-capacitor oscillator circuit onto a substrate, the substrate having a ground;
forming a first conductor between the first output terminal and the ground;
forming a second conductor between the first output terminal and the ground, the first and second conductors extending along approximately parallel planes;
forming a third conductor between the second output terminal and the ground; and
forming a fourth conductor between the second output terminal and the ground, the third and fourth conductors extending along approximately parallel planes such that the first, second, third and fourth conductors in combination yield an inductance L" that is lower than an inductance corresponding to each of the conductors, the lowered inductance yielding an increase in a maximum frequency of the inductor-capacitor oscillator circuit, each of the first, second, third and fourth conductors extending to a height above the ground that is greater than a thickness of the die such that an apex of each of the conductors is spaced above an upper surface of the die.

18. A radio-frequency module comprising:
a substrate;
a die mounted on the substrate, the die including an oscillator circuit connected to first and second output terminals that are formed on an upper surface of the die;
a first pair of conductors connecting the first output terminal and a common electrical potential of the substrate; and
a second pair of conductors connecting the second output terminal and the common electrical potential of the substrate, the first and second pair of conductors being spaced from one another, each of the first pair of conductors and second pair of conductors extend to a height above the substrate that is greater than a thickness of the die such that an apex of each of the first pair of conductors and second pair of conductors is spaced above the upper surface of the die.

19. A wireless device comprising:
an antenna configured to receive a radio-frequency signal;
a receiver circuit connected to the antenna and configured to process the received RF signal; and
a voltage controlled oscillator circuit residing on a die mounted on a substrate coupled to and configured to facilitate operation of the receiver circuit, the voltage controlled oscillator circuit connected to first and second output terminals on the die, a first pair of conductors and a second pair of conductors connecting the first and second output terminals to the substrate, respectively, the first pair of conductors spaced apart from the second pair of conductors, the first and second pair of conductors in combination having an inductance L" that is lower than an inductance corresponding to each of the conductors, the first and second pair of conductors extending along approximately parallel planes relative to each other, the first pair of conductors spaced apart from each other by a first distance, the second pair of conductors spaced apart from each other by a second distance, and the first pair of conductors spaced from the second pair of conductors by a third distance that is greater than the first distance or second distance.

\* \* \* \* \*

UNITED STATES PATENT AND TRADEMARK OFFICE
CERTIFICATE OF CORRECTION

PATENT NO. : 9,973,144 B2  
APPLICATION NO. : 15/407200  
DATED : May 15, 2018  
INVENTOR(S) : Georgi Milev Taskov Page 1 of 1

It is certified that error appears in the above-identified patent and that said Letters Patent is hereby corrected as shown below:

On the Title Page

Item (71), Applicant, Line 1, Change "CA" to --MA--.

In Column 1, Notice, After "0 days." delete "days.".

In the Specification

In Column 9, Line 58, Change "L1 '" to --L1'--.

Signed and Sealed this  
Seventh Day of August, 2018

Andrei Iancu  
*Director of the United States Patent and Trademark Office*